Nov. 13, 1956 F. R. ARAMS 2,770,722

TIME SHIFT RE-ENTRANT AMPLIFIER SYSTEM FOR CARRIER PULSES

Filed June 30, 1955 2 Sheets-Sheet 1

INVENTOR.
FRANK R. ARAMS
BY
Charles H. Brown
ATTORNEY

TIME SHIFT RE-ENTRANT AMPLIFIER SYSTEM FOR CARRIER PULSES

Filed June 30, 1955 2 Sheets-Sheet 2

INVENTOR.
FRANK R. ARAMS
BY
Charles H. Brown
ATTORNEY 2,770,722

TIME SHIFT RE-ENTRANT AMPLIFIER SYSTEM FOR CARRIER PULSES

Frank R. Arams, Rutherford, N. J., assignor to Radio Corporation of America, a corporation of Delaware Application June 30, 1955, Serial No. 519,162

7 Claims. (Cl. 250—20)

This invention relates to a time shift re-entrant amplifier system, and more particularly to an amplifier system wherein an input signal such as a radio frequency pulse is amplified in a vacuum tube, and is then delayed and re-amplified in the same tube. The vacuum tube is preferably a traveling wave tube.

The invention is particularly useful in pulse code communications and will be described as applied to a pulse time (or pulse position) modulation system wherein the intelligence is represented by the time of occurrence of pulses relative to reference times.

It is an object of this invention to provide an improved amplifier system wherein a signal is amplified in an amplifier tube and is subsequently re-amplified in the same tube.

It is another object to provide an improved system for obtaining very high amplification in a single amplifier tube.

It is a further object to provide an improved pulse amplifier including a traveling wave tube to provide increased gain by successively amplifying the pulse signal in the traveling wave tube at successively delayed non-overlapping time intervals.

According to an illustrative embodiment of the invention, a radio frequency pulse signal is applied to the signal input coupling of a traveling wave tube. A signal path including a delay device is provided from the signal output coupling of the traveling wave tube to the signal input coupling of the tube. The delay device provides a delay great enough relative to the pulse width so that the amplified and re-amplified pulses in the traveling wave tube do not overlap. The pulse may be successively re-circulated thru the traveling wave tube a number of times, the pulse being further amplified each time. The output of a gated local oscillator is applied to input electrodes of the traveling wave tube after the pulse has circulated a predetermined number of times. Mixing is accomplished in the traveling wave tube and the finally amplified pulse at a sum or difference frequency is taken from the traveling wave tube output coupling by means of a band-pass filter. According to another embodiment, a plurality of feed-back paths are provided, each path including filters and heterodyning means, and a delay device common to all paths. The finally amplified output pulse is taken from the output coupling of the traveling wave tube by means of a band-pass filter.

These and other objects and aspects of the invention will be apparent to those skilled in the art from the following more detailed description taken in conjunction with the appended drawings, wherein.

Figures 1, 3:
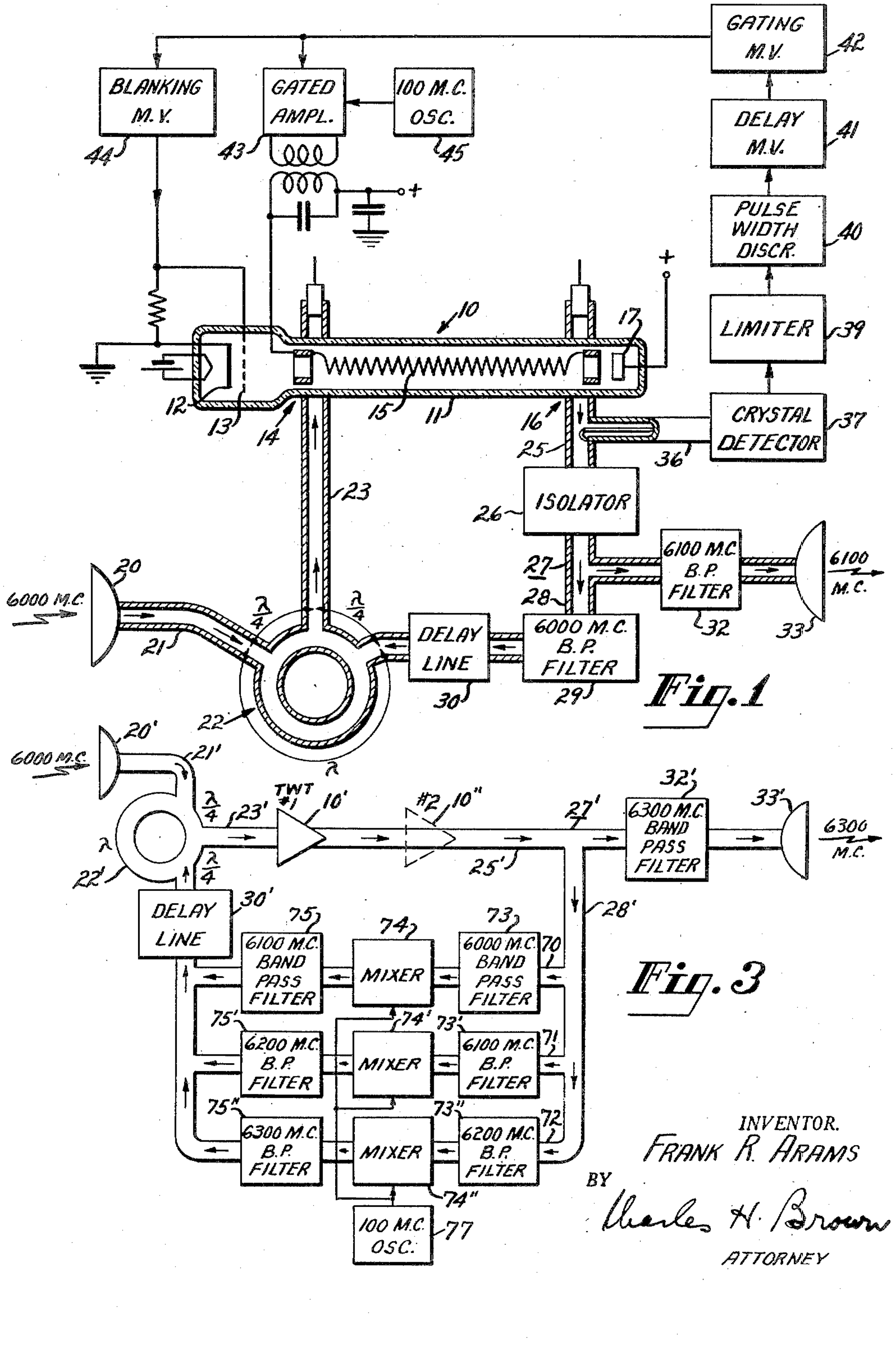
Figure 1 is a diagram of a time shift re-entrant amplifier system constructed according to the teachings of this invention.
Figure 3 is a diagram of another embodiment according to the invention.

The amplifier system of Figure 1 includes a traveling wave tube generally designated 10 and including an evacuated envelope 11, a cathode 12, a control grid 13, a signal input coupling 14, a helical electrode 15, a signal output coupling 16, and an anode 17. The traveling wave tube 10 also includes means (not shown) for focusing the tube's electron beam, such as by providing a suitable magnetic field.

A signal to be amplified is received by a directional antenna 20 and is applied over a waveguide 21 to a hybrid junction 22 shown in the form of a hybrid ring. The signal applied to the hybrid ring 22 is coupled thru the waveguide 23 to the signal input coupling 14 of the traveling wave tube 10. The amplified signal from the signal output coupling 16 of the traveling wave tube 10 is applied, a waveguide 25 thru a non-reciprocal ferrite load isolator 26, a waveguide T 27, a waveguide 28, a band-pass filter 29, and a delay line 30 to an input of the hybrid ring 22. The amplified signal applied to the hybrid ring 22 returns thru the waveguide 23 to the signal input coupling 14 of the traveling wave tube 10. It is thus apparent that a path is provided for applying an amplified signal from the signal output coupling of the traveling wave tube back to the signal input coupling of the traveling wave tube. The hybrid ring 22 is of a type known to the art and has dimensions and is so arranged that it serves to isolate the antenna 20 and delay line 30. One leg of the waveguide T 27 is connected to a band-pass filter 32 having an output coupled to a directional transmitting antenna 33. The non-reciprocal element 26 is a uni-directional transmission line section which prevents energy reflected from the band-pass filters 29 and 32 from returning to the signal output coupling 16 of the traveling wave tube 10. The non-reciprocal element 26 employs a ferromagnetic material in such a manner that energy can travel in only one direction thru the device. Other suitable one-way or uni-directional elements may be used for the isolator 26.

A portion of the signal energy in the wavelength 25 is coupled by means of a coaxial line 36 to a crystal detector 37. The output of the detector 37 is a signal constituting the envelope of the radio frequency signal in the waveguide 25. The output from detector 37 is applied thru a limiter 39, a pulse width discriminator 40, a delay multivibrator 41 and a gating multivibrator 42 to a gated amplifier 43 and a blanking multivibrator 44. The output of the blanking multivibrator 44 is coupled across the cathode 12 and the grid 13 of the traveling wave tube 10. The output of the gated amplifier 43 is coupled to the signal input coupling 14 of the traveling wave tube 10. The output of a local oscillator 45 is coupled to another input of the gated amplifier 43.

The limiter 39 may consist of a pentode or triode amplifier operated in the plate current saturation region to limit the output so as to provide a flat-topped waveform. The pulse width discriminator 40 may be of the type described in the book "Waveforms," Radiation Laboratory Series, vol. 19, page 369, Figure 10.5. The delay multivibrator 41 may be of the type described in Terman, "Radio Engineer's Handbook," 1943, page 512, Figure 32. The gating and blanking multivibrators 42 and 44 may be of the type described in the same portion of the above-identified "Radio Engineer's Handbook."

The operation of the system of Figure 1 will be described, with the aid of the chart of Figure 2, as applied to a radio relay station handling pulse time-modulated multiplex signals. In such a multiplex system, a synchronizing pulse is sent which is followed by a plurality of pulses representing the intelligence on an equal plurality of message channels. The intelligence carried by each pulse is represented by the position of the pulse in time with respect to a reference position. It will be understood that the invention is equally applicable to various other forms of pulse communications.

Figure 2:
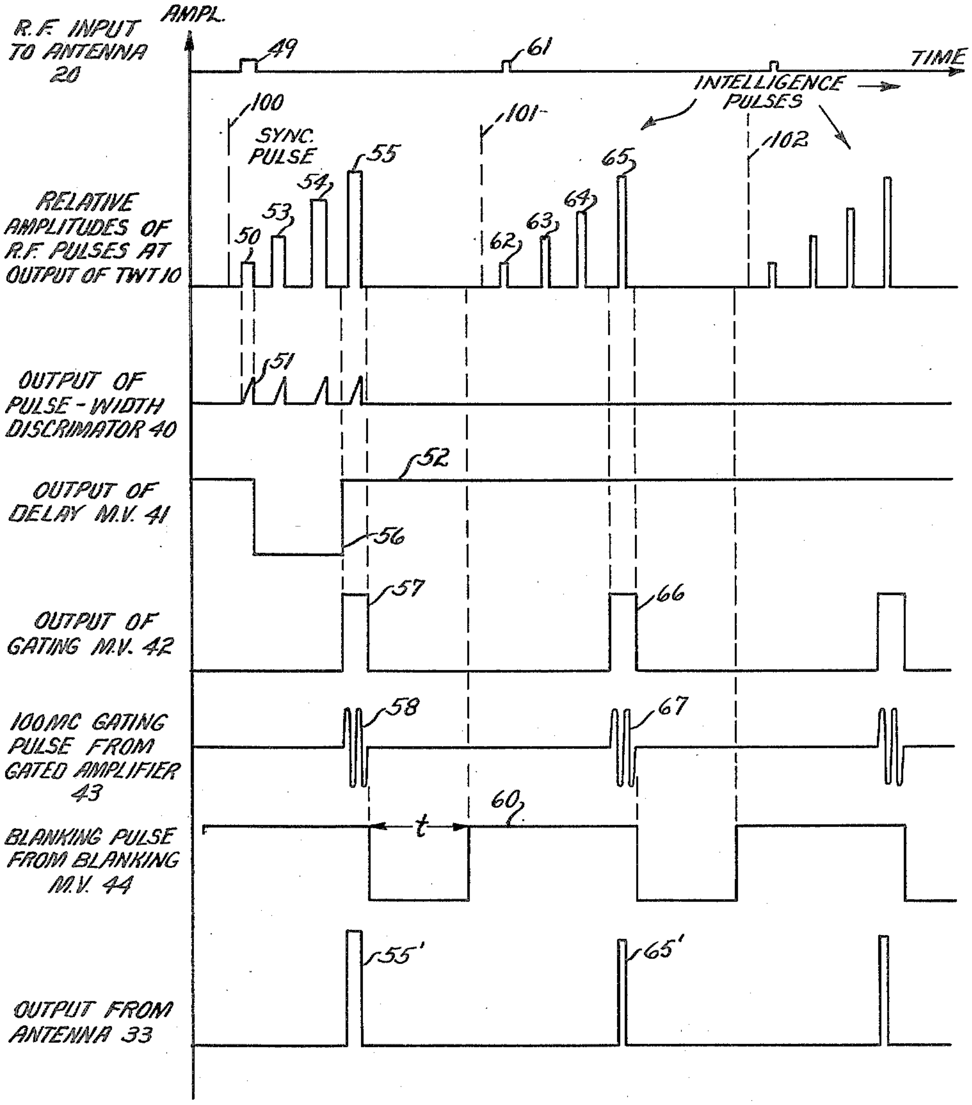
Figure 2 is a chart which will be used in explaining the operation of the system of Figure 1 in amplifying a pulse time modulation signal.

A radio frequency synchronizing pulse 49 in Figure 2 having a radio frequency in a range represented as 6000 megacycles is received by antenna 20 and applied thru waveguide 21, hybrid ring 22 and waveguide 23 to the signal input coupling 14 of the traveling wave tube 10. The pulse is amplified in the traveling wave tube 10 and appears at the output coupling 16 as an amplified radio frequency pulse having an envelope as represented by the numeral 50 in the chart of Figure 2. A portion of the output signal is coupled by coaxial line 36 to the crystal detector 37 which provides an envelope signal applied thru the limiter 39 to the pulse width discriminator 40. The pulse width discriminator 40 is provided for the purpose of distinguishing synchronizing pulses from intelligence pulses. For purposes of illustration, it is assumed that the system is one wherein synchronizing pulses are wider than intelligence pulses. The pulse width discriminator provides an output only in response to the wider synchronizing pulses. The output of the pulse width discriminator is represented by the numeral 51. The output of the pulse width discriminator 40 triggers the delay multivibrator 41 to provide a waveform as represented by the numeral 52 in the chart of Figure 2.

The amplified synchronizing pulse at the signal output coupling 16 of the traveling wave tube 10 is applied over a path leading back to the signal input coupling 14 of the traveling wave tube. The path includes the non-reciprocal ferrite element 26, the waveguide T 27, waveguide 28, the 6000 megacycle band-pass filter 29, the delay line or delay device 30, the hybrid ring 22 and the waveguide 23. The synchronizing pulse is then amplified a second time in the traveling wave tube 10 and appears in amplified form at the signal output coupling 16 in the form represented by the numeral 53, in the chart of Figure 2. The radio frequency synchronizing pulse continues to circulate thru the tube appearing at the output coupling as a further amplified pulse 54 and again as a still further amplified pulse 55. According to the present illustration the synchronizing pulse is passed thru the traveling wave tube four times, the pulse being delayed each time it goes thru the feed-back path by the delay line 30.

The output of delay multivibrator 41 is designed to provide an output voltage transition, represented by the numeral 56, just prior to the last or fourth circulation of the synchronizing pulse thru the traveling wave tube 10. The voltage transition 56 from the delay multivibrator triggers the gating multivibrator 42 to provide an output gate as designated by the numeral 57. This gate is applied to the gated amplifier 43, which is also receptive on another input to the output of the 100 megacycle oscillator 45. Therefore, the output of the gated amplifier 43 is a burst of 100 megacycle oscillations as represented by the numeral 58. The burst of oscillations from the gated amplifier 43 is applied to a signal input coupling of the traveling wave tube 10 such as by coupling the oscillations across one end of the helical electrode 15 and the cathode. It will be understood that there are various known ways of coupling both a signal and a local oscillation to a traveling wave tube so that they will be mixed in the traveling wave tube.

The synchronizing pulse applied for the fourth time thru the waveguide 23 to the input coupling 14 of the traveling wave tube 10 mixes with the local oscillation from the oscillator 45 applied thru the gated amplifier to another input coupling of the traveling wave tube 10. A mixing or heterodyning action takes place within the traveling wave tube 10 so that there appears at the output coupling 16 a signal at 6000 megacycles and sum and difference frequency signals at 5900 megacycles, 6100 megacycles, and other frequencies. In the present example, the sum frequency of 6100 megacycles is passed by the band-pass filter 32 from the waveguide T 27 to the transmitting antenna 33. It is thus apparent that the received radio frequency synchronizing pulse is amplified four times in the traveling wave tube 10, is heterodyned to a higher frequency, and is then transmitted on from the transmitting antenna 33 as a single synchronizing pulse as represented by numeral 55' in the chart of Figure 2.

The trailing edge of the pulse 57 from the gating multivibrator 42 triggers the blanking multivibrator 44 to provide a waveform designated 60. The output of the blanking multivibrator 44 is applied across the grid and cathode electrodes 13 and 12 of the traveling wave tube 10 for an interval *t* to prevent continued circulation and amplification of the 6000 megacycle signal by turning off the electron beam in the traveling wave tube. Under these conditions, any pulse applied to the input 14 of the traveling wave tube is attenuated in the matched attenuator in the traveling wave tube and substantially no reflections result.

After the synchronizing pulse has been amplified and re-transmitted, a first intelligence modulated pulse 61 is received. This intelligence pulse is successively amplified in the manner described in connection with the synchronizing pulses to provide pulses of successively higher amplitude 62, 63, 64 and 65. It will be noted that the intelligence pulses are narrower or otherwise distinguished from the synchronizing pulses so that no output is provided from the pulse width discriminator 40. The delay multivibrator 41 operates with a period corresponding with one complete cycle of the multiplex system including one synchronizing pulse and associated intelligence pulses. The gating multivibrator 42 has a natural period corresponding with the time separation between reference times 100, 101, 102 etc. as shown by a properly designated waveform in Figure 2. A gate pulse 66 from the gating multivibrator 42 gates the 100 megacycle oscillations from the oscillator 45 in the gated amplifier 43 to provide a burst of oscillations 67 applied to the traveling wave tube 10. A finally amplified output intelligence modulated pulse 65' at the sum frequency 6100 megacycles is then passed by the filter 32 to the transmitting antenna 33. In similar manner, subsequent intelligence pulses are amplified and retransmitted. The amplified and retransmitted pulses carry the same intelligence as the received pulses, regardless of whether the intelligence is in the form of the amplitude of the pulses or the width of the pulses or the position of the pulses. If amplitude modulation is employed, the number of times the signal is reamplified should not be so great that saturation limiting occurs in the traveling wave tube. According to an alternative arrangement, the limiter 39 and the pulse width discriminator 40 may be omitted and the multivibrators constructed to provide the gates and blanking pulses at the appropriate time following receipt of each pulse whether it is a synchronizing pulse or an intelligence pulse.

Figure 3 shows a system wherein an input signal is amplified and re-amplified in a traveling wave tube, and wherein the paths in which the signal circulates includes heterodyning means, band-pass filters and a delay line common to all paths. The elements in Figure 3 corresponding with those in Figure 1 are given the same reference numerals with prime designations added. The system of Figure 3 differs from that of Figure 1 in that the feed-back path is branched to provide three separate branches 70, 71 and 72. Each branch includes, in the order named, a first selective band-pass filter 73, a mixer 74, and a second selective band-pass filter 75. The output of the common local oscillator 77 is applied to all of the mixers 74. A delay line 30' is positioned in the portion of the feed-back path common to all the branches 70, 71 and 72.

In the operation of the system of Figure 3, an input pulse received by the receiving antenna 20' is applied thru the waveguide 21' and the hybrid ring 22' to the traveling wave tube 10'. A second traveling wave tube 10'' may be connected in series with the traveling wave tube 10'. The received radio frequency pulse at 6000 megacycles is amplified in the traveling wave tube and applied thru the 6000 megacycle band-pass filter 73 to the mixer 74. The resulting sum frequencies at 6100 megacycles are passed by the filter 75, thru the delay line 30' back to the input of the traveling wave tube 10'. The amplified radio frequency pulse at 6100 megacycles is applied from the output of the traveling wave tube thru the band-pass filter 73' to the mixer 74'. The sum frequency at 6200 megacycles from the mixer 74' is passed by the filter 75'. The output from the filter 75' goes thru the delay line 30' and back to the input of the traveling wave tube 10'. The signal is then amplified a third time and circulated thru the path 72 wherein the signal is heterodyned to 6300 megacycles. The 6300 megacycle signal is delayed by the delay line 30', is amplified in the traveling wave tube 10' and is passed thru the band-pass filter 32' to the radiating antenna 33'. It is thus apparent that according to the system of Figure 3, an input pulse is amplified four times, the first time at the received frequency, and the other three times at successively increasing frequencies, and is then transmitted from the transmitting antenna 33'.

What is claimed is:

1. A pulse amplifier comprising an amplifier tube having a signal input coupling and a signal output coupling, means to apply a signal to said input coupling, an input signal pulse path from said output coupling to said input coupling including a signal delay device providing a delay greater than the duration of the input signal pulse, means for causing a signal component of a predetermined frequency to appear in said output coupling only after said input signal pulse has circulated through the amplifier tube a predetermined number of times, and means including a frequency-selective device for deriving an output of said predetermined frequency from said output coupling.

2. An amplifier system comprising a traveling wave tube including first and second signal input couplings and a signal output coupling, means to apply an input signal to said first input coupling, a signal path from said output coupling to said first input coupling, a delay device in said path, a local oscillator, timing means to apply the output of said oscillator to said second input coupling only after said input signal has circulated thru the tube a predetermined number of times, and a filter having an input coupled to said signal output coupling to pass sum or difference frequencies.

3. An amplifier system comprising a traveling wave tube including means for producing an electron beam, first and second signal input couplings and a signal output coupling, means to apply an input to said first signal input coupling, a signal path from said output coupling to said first input coupling, a delay device in said path, a local oscillator, timing means to apply the output of said oscillator to said second input coupling only after said input signal has circulated thru the tube a predetermined number of times, a filter having an input coupled to said signal output coupling to pass sum or difference frequencies, and further timing means to cut off the electron beam in said traveling wave tube after an output has been obtained from said filter.

4. A pulse amplifier comprising an amplifier tube having a signal input coupling and a signal output coupling, means to apply an input signal pulse to said input coupling, a plurality of signal paths from said output coupling to said input coupling, said paths including a common portion having a delay device therein, said delay device providing a delay greater than the duration of the input signal pulse, a band-pass filter and a mixer in each of said paths, a single local oscillator having an output coupled to each of said mixers, and a filter having an input coupled to said output coupling to pass an amplified and reamplified signal.

5. An amplifier system comprising a traveling wave tube including first and second signal input couplings and a signal output coupling, means to apply an input signal in the microwave frequency range to said first input coupling, a signal path from said output coupling to said first input coupling, a delay device in said path, a local oscillator having a frequency which is low with respect to the microwave frequency of said input signal, timing means to apply the output of said oscillator to said second input coupling only after said input signal has circulated through the tube a predetermined number of times, and a filter having an input coupled to said output coupling to pass sum or difference frequencies.

6. An amplifier system comprising a traveling wave tube including first and second signal input couplings and a signal output coupling, means to apply an input signal to said first input coupling, a signal path from said output coupling to said first input coupling, a delay device in said path, a local oscillator, a gated amplifier having its input coupled to the output of said oscillator and its output coupled to said second input coupling, means for controlling said amplifier to gate the output of said oscillator to said second input coupling only after said input signal has circulated through the tube a predetermined number of times, and a filter having an input coupled to said output coupling to pass sum or difference frequencies.

7. A pulse amplifier system comprising a traveling wave tube including first and second signal input couplings and a signal output coupling, means to apply an input signal pulse to said first input coupling, a signal path from said output coupling to said first input coupling including a delay device providing a delay greater than the duration of the input signal pulse, a local oscillator, a gated amplifier having its input coupled to the output of said oscillator and its output coupled to said second input coupling, means for controlling said amplifier to gate the output of said oscillator to said second input coupling only after said input signal has circulated through the tube a predetermined number of times, and a filter having an input coupled to said output coupling to pass sum or difference frequencies.

References Cited in the file of this patent

UNITED STATES PATENTS

| | | |
|---|---|---|
| 1,657,462 | Espenschied | Jan. 31, 1928 |
| 2,593,113 | Cutler | Apr. 15, 1952 |
| 2,597,029 | Phinney et al. | May 20, 1952 |
| 2,735,933 | Pierce | Feb. 21, 1956 |

FOREIGN PATENTS

| | | |
|---|---|---|
| 680,319 | Great Britain | Oct. 1, 1952 |